Sept. 20, 1966 J. WISLOCKY 3,274,457

SEMICONDUCTOR ENCAPSULATED AND SEALED WITHIN HOUSING

Filed Feb. 26, 1963 2 Sheets-Sheet 1

INVENTOR.
JOE WISLOCKY

BY

OSTROLENK, FABER, GERB & SOFFEN
ATTORNEYS

SEMICONDUCTOR ENCAPSULATED AND SEALED WITHIN HOUSING

Filed Feb. 26, 1963 2 Sheets-Sheet 2

INVENTOR.
JOE WISLOCKY
BY
OSTROLENK, FABER, GERB & SOFFEN
ATTORNEYS

3,274,457
SEMICONDUCTOR ENCAPSULATED AND SEALED WITHIN HOUSING

Joe Wislocky, El Segundo, Calif., assignor to International Rectifier Corporation, El Segundo, Calif., a corporation of California Filed Feb. 26, 1963, Ser. No. 261,109
4 Claims. (Cl. 317—234)

This invention relates to a novel arrangement of standard sealed semiconductor device in various arrays within auxiliary sealed housings.

Many products are required in which one or more junctions are required for a device either alone or in various series-parallel combinations.

In the past, a bare junction has been handled throughout the manufacturing operation where the bare junction is, for example, handled differently for each different product. In the event that the junction containing wafer deteriorates for some reason during the assembly process of the wafer with the remaining structural elements of the product, this is generally not known until the product is completely finished and tested. Thus, a product which cannot be used because of an adversely affected junction has nevertheless gone through the complete manufacturing cycle and a relatively expensive reject item results.

Moreover, since the bare junction containing wafers must be directly handled, great care must be taken during manufacturing, and the junction must be handled differently from product to product. Thus, each product requires relatively complex and expensive manufacturing techniques particular to that product which will increase manufacturing costs.

The principle of the present invention is to provide a basic sealed wafer which is pre-tested, and is assembled in a plurality of different products without the requirement for special handling and without the danger that after the product is completely manufactured, it will be determined that the junction has been damaged during manufacture.

In a first embodiment of the invention, and where a wafer of semiconductor material having a junction therein is to be contained within a so-called "top-hat" type hermetically sealed container, the previously sealed and tested wafer will be placed within the container rather than a bare junction, as has been done in the past. Thus, the novel product formed will include a basic sealed junction within a second hermetically sealing container. It is, of course, clear that the basic sealed junction could be used in any type of hermetically sealed container such as the flangeless-type container which is similar to the "top-hat" construction.

The principle of the present invention which is to utilize a basic sealed junction containing wafer for assembly in other sealing housings can, of course, be extended to many different applications. Thus, as a further application of the invention, a large plurality of previously sealed wafers can be placed physically adjacent one another and electrically connected in series, and thereafter the complete assembly can be potted, or otherwise appropriately housed in a second and auxiliary housing, to form a high voltage-type cartridge, or the like.

In a similar manner, and in accordance with a further embodiment of the invention, a plurality of the previously sealed junction containing wafers can be interconnected in an appropriate circuit such as a bridge-type circuit with the device thereafter potted or otherwise appropriately housed with extending plug-type terminals extending from the auxiliary outer housing for connection in a plug-in type manner.

In a still further embodiment of the invention, a large number of devices which have been previously sealed may be placed adjacent one another, but not electrically interconnected. This large plurality of devices is then, in accordance with the inventive concept of the invention, potted to form a common auxiliary housing which can, for example, have break-off sections therein to permit breaking off of any desired number of sealed junction containing wafers which are needed for a particular application. Thereafter, the terminals of each of the devices which extend from the outer auxiliary housing may be appropriately connected as desired by the user. Thus, it now becomes possible for a user of diodes to buy a long string of elements from which he will break off the number which he needs for a particular application.

Accordingly, a primary object of this invention is to provide a novel basic sealed junction containing wafer that can be used in several different types of semi-conductor devices.

Another object of this invention is to simplify the manufacturing process of a manufacturer of several different types of semiconductor devices.

A further object of this invention is to provide a novel basic sealed junction containing wafer which is adapted for use in products which will form an auxiliary housing about the basic element.

A further object of this invention is to provide a novel arrangement for eliminating the need to handle exposed wafers during the assembly of various types of semiconductor products.

A further object of this invention is to reduce the number of rejects found after a semiconductor product is completely assembled.

These and other objects of this invention will become apparent from the following description when taken in connection with the drawings, in which.

Figure 1:
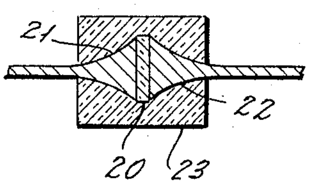
FIGURE 1 is a cross-sectional view of a basic sealed junction containing wafer which is used in the present invention.
Figure 2:
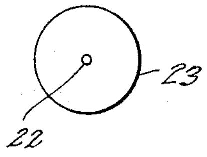
FIGURE 2 is a side plan view of the basic element of FIGURE 1.
Figure 4:
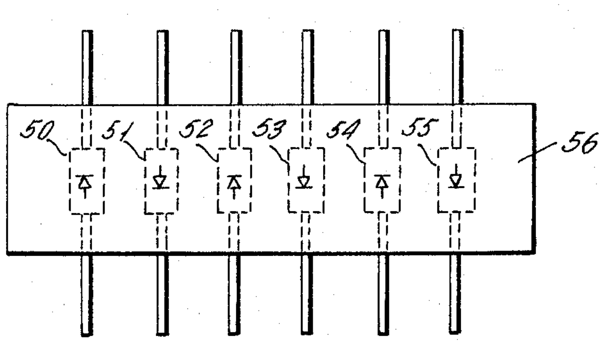
FIGURE 4 illustrates the manner in which a plurality of the basic sealed junction containing wafers can be placed adjacent one another and potted by a common auxiliary housing.
Figures 8, 9:
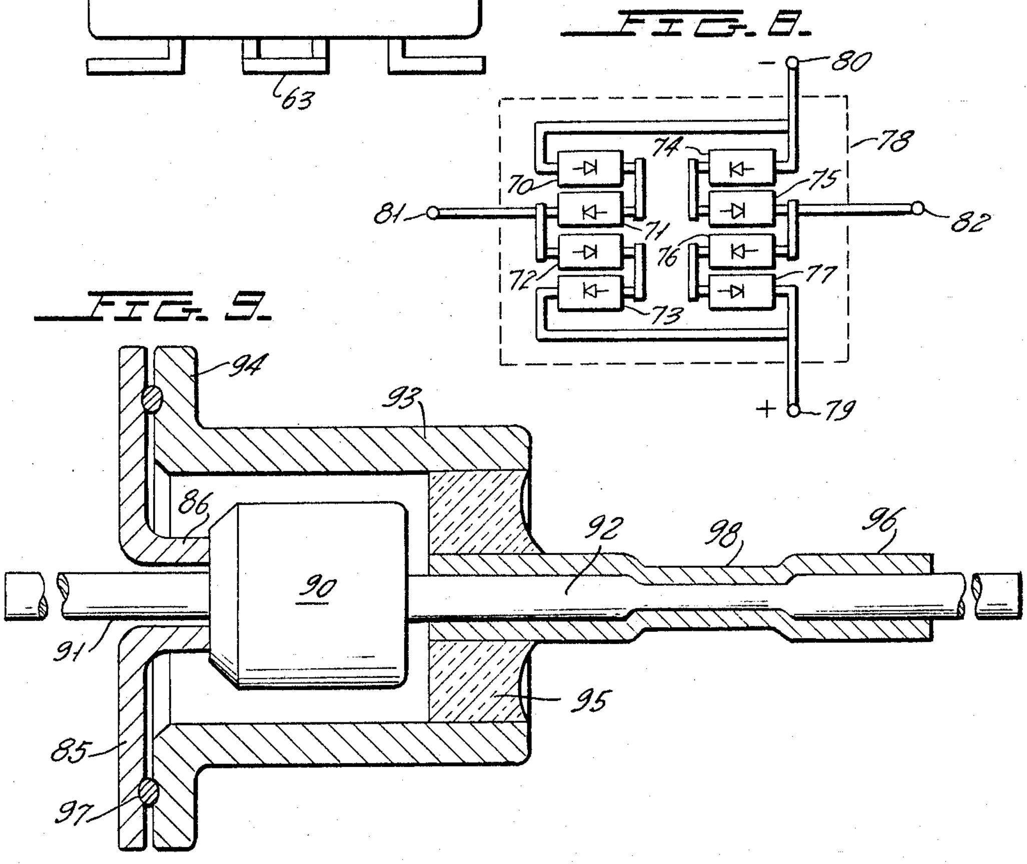

FIGURE 8 schematically illustrates how eight of the basic elements of FIGURES 1 and 2 or arrangements of FIG. 4, as required, can be arranged to form a single phase bridge connected rectifier system having two series diodes in each bridge arm which is thereafter potted in a common housing.

FIGURE 9 is a side cross-sectional view of a "top-hat" rectifier assembly wherein the rectifying element is formed of the basic sealed element of FIGURES 1 and 2.

Figure 10:
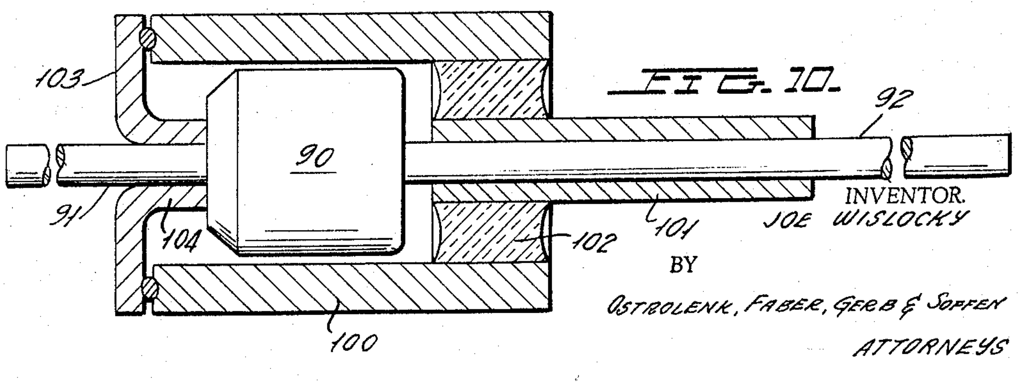

FIGURE 10 illustrates the manner in which the basic sealed wafer element of FIGURES 1 and 2 can be assembled in a flangeless housing.

Referring now to FIGURES 1 and 2, I have illustrated therein a semiconductor type device wherein a basic wafer 20 which may be, for example, of silicon and which will have one or more junctions therein has its opposing surfaces connected to two leads 21 and 22 with the complete assembly being potted within a housing 23.

The principle of the present invention is to use this type of basic semiconductor element in place of previously used bare junctions in the assembly of other semiconductor products.

The basic device of FIGURES 1 and 2 can be produced by proven mass production techniques with high reliability. As a typical example, the wafer 20 may be of silicon with a single junction therein to form a diode having a voltage rating of 1000 volts and a current rating of 1 ampere. The potting material 23 may be formed, by way of example, of epoxy molding compound, and could have a diameter of 0.140 inch and a length of 0.150 inch. The lead wires 21 and 22 can, for example, have a diameter of 0.031 inch wherein the lead wires are slightly flared out at their ends, as illustrated, to accommodate the large surface area of the wafer 20.

Figure 3:
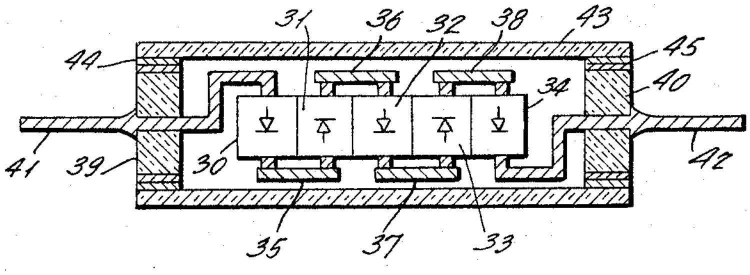
FIGURE 3 illustrates the manner in which the basic sealed wafers of FIGURES 1 and 2 may be arranged in a series array and potted within an auxiliary hermetically sealed housing to form a high voltage cartridge.
Figure 5:
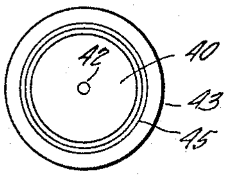
FIGURE 5 is a side plan view of FIGURE 3.

Referring now to FIGURES 3 and 5 which illustrate a first embodiment of the invention, a plurality of basic elements 30, 31, 32, 33 and 34, which are each identical to the device of FIGURES 1 and 2, are to be connected in series to form a high voltage rectifier component. In accordance with the invention, these basic elements are placed immediately adjacent one another with their polarities being arranged as indicated schematically so that the cathode of one element is immediately adjacent the anode of the adjacent element.

The extending leads of elements 31, 32 and 33 are clipped short with the adjacent leads being electrically and mechanically connected together by copper jumpers 35, 36, 37 and 38 which are preferably welded to the various leads of devices 30 through 34 to which they are connected. It has been found that this welding operation can be performed satisfactorily, and without causing deterioration of the individual devices.

Thereafter, the input lead of element 30 and output lead of element 34 are arranged, as illustrated, and two metallized ceramic end buttons 39 and 40 are slid over the leads 41 and 42 respectively.

This assembly is then placed in a cylindrical ceramic tube 43 which can be of alumina porcelain which has metallized end portions 44 and 45. The end buttons 39 and 40 are then soldered to metallized portions 44 and 45 and the leads 41 and 42 are similarly soldered to end buttons 39 and 40 respectively to form a suitable ceramic-to-metal hermetic seal. If desired, the interior of tube 43 can first be filled with an appropriate inert gas such as nitrogen, or can be potted with an appropriate high heat conductivity epoxy resin with care being taken that no voids are created during the potting operation.

The resulting device, where 1,000 volts junctions are used for elements 30 through 34, is a high voltage cartridge having a rating of 5,000 volts. It will be apparent that any desired number of individual junctions could be used in the assembly of the cartridge of FIGURE 3 so that any appropriate rating can be reached.

It will be noted that the assembly of the cartridge does not require, at any step, that a bare junction be handled. Thus, the novel arrangement provides a high voltage cartridge which has very little space requirement, although it can be manufactured with a low rate of rejections.

Figure 6:
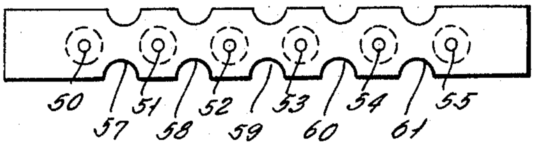
FIGURE 6 illustrates a side plan view of FIGURE 4, and particularly indicates the break-off sections between the adjacently positioned elements to permit a user to take as many elements as are desired from a long chain of elements.

Referring next to FIGURES 4 and 6, I have illustrated therein another manner in which the basic sealed junctions of FIGURES 1 and 2 may be arranged. Thus, devices 50 through 55 are placed separated from one another, as illustrated, and are held in an appropriate jig. Thereafter, the assembly, which may be as long as desired and could, for example, have a length of 12 inches to thereby accommodate the order of 40 individual sealed junctions, is potted with an auxiliary hermetically sealed housing 56 which could be of any appropriate potting material such as an epoxy, wherein break-off grooves such as grooves 57 through 61 are provided between adjacent elements.

Figure 7:
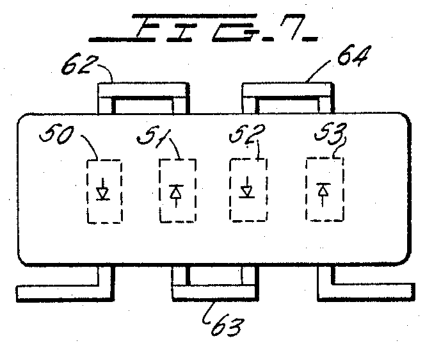
FIGURE 7 illustrates how four of the elements of FIGURES 5 and 6 have been broken off and connected to form a series connection of four diodes.

This strip of elements may now be sold to an ultimate user who, depending upon his application, will break off whatever number of elements he requires, and use them in an appropriate manner. By way of example, FIGURE 7 illustrates the use of the first four diodes 50 through 53 which have been connected in series by welded jumpers 62, 63 and 64.

Clearly, almost any desired circuit arrangement could be formed from the arrangement of FIGURES 4 and 6.

A still further illustration of the manner in which the basic elements of FIGURES 1 and 2 may be used with an auxiliary housing is shown in FIGURE 8 for eight elements 70, 71, 72, 73, 74, 75, 76 and 77. Appropriate circuit connections are made, as illustrated in FIGURE 8, to connect the elements in a single phase, full-wave bridge-connected rectifier having two rectifier elements in series for each arm of the bridge. Thereafter, and as illustrated in dotted lines 78, the assembly is potted by an appropriate potting compound with only the terminals, such as D.-C. terminals 79, 80 and the A.-C. terminals 81 and 82, extending from the potted system. If desired, these terminals 79 through 82 could be in the form of prongs which can be received by an appropriate tube-type socket.

It is to again be noted that in forming the device of FIGURE 8, it was unnecessary to handle bare junctions so that the chance of a reject of the complete finished product is much smaller than in the case where bare junctions are used.

Referring next to FIGURE 9, I have illustrated how a single of the pre-sealed and protected junctions of FIGURES 1 and 2 can be utilized in a so-called "top-hat" type of housing. Referring to FIGURE 9 which shows the novel arrangement in cross-section, I have illustrated therein a single basic sealed junction 90 having extending leads 91 and 92 which correspond to leads 21 and 22 respectively of the device of FIGURES 1 and 2. This self-sealed unit is then placed within a hermetically sealing enclosure which is formed by a flanged upper housing portion 93 which has a flange 94 thereon, and is secured to an extending tubular member 96 through a glass button 95. The manner in which members 93, 94, 95 and 96 are sub-assembled is well known to the art, and does not form a part of the present invention.

As illustrated in the drawing, during assembly of the device a base plate 85 which is formed of an appropriate nickel-iron alloy and has an extending portion 86 is slid over lead 91 until the left-hand surface of housing 90 falls against the extending portion 86. Thereafter, a weld is formed between extension 86 and conductor 91 by an appropriate annular welding electrode means. This weld is made in such a manner that the area between the interior of extension 86 and the exterior of lead or conductor 91 is completely hermetically sealed. Thereafter, lead 92 is inserted in tube 96 and flange 94 is seated on base plate 85. An annular weld is then formed between flange 94 and base plate 85, as schematically illustrated by weld 97. This weld will provide a hermetic seal between the bottom of flange 94 and the right-hand surface of base plate 85. Finally, a crimp and weld is formed between tube 96 and conductor 92, as illustrated at welded crimp 98, whereby a hermetic seal is formed between tube 96 and conductor 92.

The resulting device is one which will meet all industrial and government specifications wherein the junction used was a pre-tested junction previously sealed and protected so that it was unnecessary to handle a bare junction. Thus, there is a substantially greater chance that the finished product will meet the required tests, since there is less chance of the junction deteriorating during the manufacturing process.

It is to be noted that the interior of housing 93 could be filled with nitrogen gas or an appropriate inert potting material, if desired.

FIGURE 10 illustrates the manner in which the novel basic sealed junction 90 can be assembled within the flangeless type of housing. Thus, in FIGURE 10 a housing is formed of a cylinder 100 which is connected to tube 101 by means of a glass bead 102. The housing is completed by means of the base plate 103 which has an extending section 104 which appropriately positions sealed wafer 90 with respect to plate 103.

In assembling the device, lead 91 is first inserted into the extending collar 104 of plate 103 until the diode 90 strikes the top of collar 104. Thereafter, a weld is made around the inner surface of collar 104 to weld this collar to lead 91 and form a hermetic seal between these two members.

Thereafter, the housing 100 which has been previously formed to have the tube 101 sealed thereto through bead 102 receives lead 92 until the annular welding projection 97 strikes the right hand surface of base plate 103. Thereafter, a weld is performed to weld the welding projection 97 to plate 103 whereupon the complete assembly is now hermetically sealed. Note that an appropriate inert gas, or the like, could be placed in the interior of the housing prior to the final welding operation. It will be noted that the assembly of the structure of FIG. 9 requires the same type of tube crimp and weld as in the embodiment of FIG. 9.

From the foregoing, it will be seen that the novel use of the unitary pre-sealed junction lends itself to great flexibility of use which can run through a large number of different products manufactured by any one organization.

The complete manufacturing system of a plant is substantially simplified in that bare wafers which require different handling from product to product because of their essential sensitive nature are now replaced by protected wafers which can receive consistent handling, regardless of the device for which they are used. Thus, the plant can now manufacture, on a mass production scale, the basic wafers with their respective sealed housing wherein such elements can be easily manufactured with a high degree of reliability. Moreover, once these devices are tested, there is little chance that they will deteriorate after assembly into a final product, as is the case when the bare wafer is handled. Thus, the total number of rejects in a plant is substantially reduced.

Although this invention has been described with respect to its preferred embodiments, it should be understood that many variations and modifications will now be obvious to those skilled in the art, and it is preferred therefore that the scope of this invention be limited not by the specific disclosure herein but only by the appended claims.

What is claimed is:

1. In combination; a semiconductor wafer, a homogeneous hermetic enclosure for said semiconductor wafer having leads from said wafer extending therethrough, and a second hermetic enclosure enclosing said homogeneous enclosure and having leads extending therefrom which are at least electrically continuous with said leads of said wafer; said homogeneous hermetic enclosure being cylindrical; said second hermetic enclosure comprising a cylindrical wall portion having a front-end portion and rear-end portion at the respective ends thereof; the interior of said second hermetic enclosure being spaced from the exterior of said homogeneous hermetic enclosure to define a volume between the interior surface of said second hermetic enclosure and the exterior of said homogeneous hermetic enclosure; said cylindrical wall portion and its said front and rear-end portions defining a gas tight seal between the exterior of said second hermetic enclosure and said volume interior of said second hermetic enclosure.

2. The combination substantially as set forth in claim 1 wherein said cylindrical wall portion is comprised of conductive material; said conductive cylindrical wall portion being electrically connected to one of said leads extending from said wafer.

3. The device substantially as set forth in claim 1 wherein said volume is filled with a high dielectric constant material.

4. The device substantially as set forth in claim 2 wherein said front-end wall comprises an extending flange of conductive material.

References Cited by the Examiner

UNITED STATES PATENTS

| | | | |
|---|---|---|---|
| 2,619,227 | 11/1952 | Arthur | 206—56 |
| 2,761,891 | 9/1956 | Violette | 174—50.54 XR |
| 2,979,645 | 4/1961 | Maiden | 317—234 |
| 3,046,516 | 7/1962 | Tymkewicz | 174—153 X |
| 3,081,374 | 3/1963 | Burch | 174—52 |

JOHN W. HUCKERT, *Primary Examiner.*

DAVID G. GALVIN, *Examiner.*

J. A. ATKINS, J. D. KALLAM, *Assistant Examiners.*